United States Patent
Zhou et al.

(10) Patent No.: US 9,357,290 B2
(45) Date of Patent: May 31, 2016

(54) SPEAKER SYSTEM AND METHOD FOR DRIVING SAME

(71) Applicants: AAC Acoustic Technologies (Shenzhen) Co., Ltd., Shenzhen (CN); AAC Acoustic Technologies (Changzhou) Co., Ltd., Changzhou (CN)

(72) Inventors: Rong-guan Zhou, Shenzhen (CN); Hong-xing Wang, Shenzhen (CN); Jing He, Shenzhen (CN); Bin Xu, Shenzhen (CN)

(73) Assignees: AAC ACOUSTIC TECHNOLOGIES (SHENZHEN) CO., LTD., Shenzhen (CN); AAC ACOUSTIC TECHNOLOGIES (CHANGZHOU) CO., LTD., Changzhou, Jiangsu (CN)

( * ) Notice: Subject to any disclaimer, the term of this patent is extended or adjusted under 35 U.S.C. 154(b) by 460 days.

(21) Appl. No.: 13/678,524

(22) Filed: Nov. 15, 2012

(65) Prior Publication Data

US 2013/0259268 A1    Oct. 3, 2013

(30) Foreign Application Priority Data

Apr. 2, 2012    (CN) .......................... 2012 1 0096163

(51) Int. Cl.
| | |
|---|---|
| *H03F 99/00* | (2009.01) |
| *H04R 1/02* | (2006.01) |
| *H04R 1/28* | (2006.01) |
| *H03F 3/68* | (2006.01) |
| *H04R 3/12* | (2006.01) |
| *H04R 3/14* | (2006.01) |
| *H04R 7/04* | (2006.01) |

(52) U.S. Cl.
CPC ................ *H04R 1/2811* (2013.01); *H03F 3/68* (2013.01); *H04R 3/12* (2013.01); *H04R 3/14* (2013.01); *H04R 7/045* (2013.01); *H04R 2499/11* (2013.01)

(58) Field of Classification Search
CPC .......... H04R 1/345; H04R 9/06; H04R 9/063; H04R 1/2811; H04R 3/12; H04R 3/14; H04R 7/045; H04R 2499/11; H03F 3/68
USPC ............. 381/337, 338, 339, 59, 87, 111, 116, 381/120, 124, 332, 333, 345
See application file for complete search history.

(56) References Cited

U.S. PATENT DOCUMENTS

| | | | |
|---|---|---|---|
| 6,411,720 B1 * | 6/2002 | Pritchard | H04R 1/2857 181/156 |
| 2005/0207593 A1 * | 9/2005 | Praestgaard | H04R 1/24 381/99 |
| 2012/0076313 A1 * | 3/2012 | Junius | H04R 25/70 381/60 |

* cited by examiner

*Primary Examiner* — Vivian Chin
*Assistant Examiner* — William A Jerez Lora
(74) *Attorney, Agent, or Firm* — Anova Law Group, PLLC

(57) ABSTRACT

Disclosed is a speaker system. The speaker system includes a multimedia unit including a plurality of speaker units, a resonance medium for supporting the multimedia unit, a number of low frequency vibrators assembled with the multimedia unit and located between the multimedia unit and the resonance medium, a driving unit for providing high frequency audio signals to the speaker units and low frequency audio signals to the low frequency vibrators. A resonance member is formed by the low frequency vibrators and the resonance medium for producing low frequency sound.

8 Claims, 2 Drawing Sheets

SPEAKER SYSTEM AND METHOD FOR DRIVING SAME

FIELD OF THE INVENTION

The present invention generally relates to a speaker system for a multimedia device, and to a method for driving the speaker system.

DESCRIPTION OF RELATED ART

Multimedia devices are widely used for showing the users pictures, videos, or music. Speaker system is a key element in the multimedia device for providing the users with sounds. Generally, each multimedia device, such as a notebook, a panel computer, a mobile internet device, includes a built-in speaker system for providing sounds. Multimedia contents carried by the multimedia devices are more and more exuberant and the users desire the devices to provide sounds with excellent performance.

The speaker system generally includes a driving unit for providing signals of sound, and a speaker unit for receiving the signals and then generating sounds based on the signals. Low frequency sound is important to improve the performance of the sound generated by the speaker unit. However, the speaker system in the general speaker system cannot provide improved low frequency sound, which cannot satisfy the demand of the users on sound quality.

Therefore, there's a need to provide the user with an improved speaker system for a multimedia device, and with a method for driving the speaker system.

DETAILED DESCRIPTION OF THE EXEMPALRY EMBODIMENT

Reference will now be made to describe the exemplary embodiment of the present invention in detail.

Figure 1:
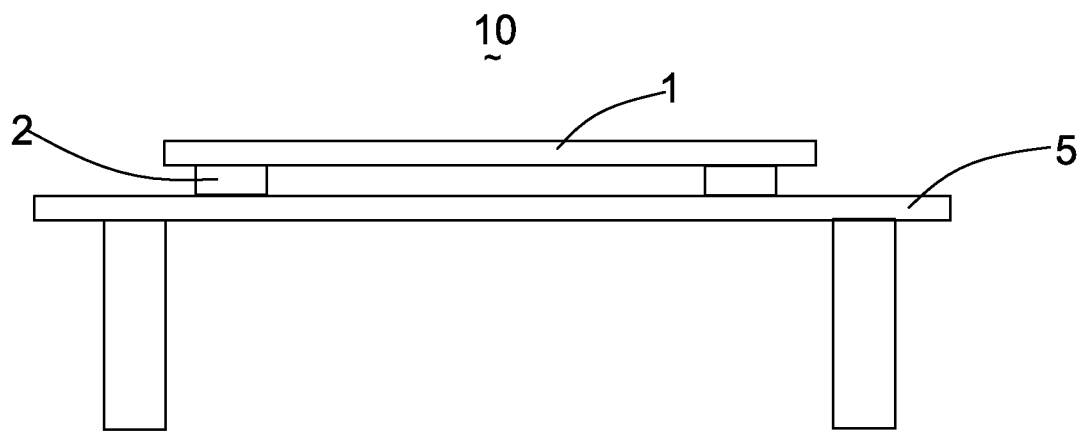
FIG. 1 is a schematic illustration of a speaker system in accordance with one exemplary embodiment of the present invention, used in an exemplary situation.

Referring to FIG. 1, which is a schematic illustration of a speaker system in accordance with one exemplary embodiment of the present invention, used in an exemplary situation, the speaker system 10 includes a multimedia unit 1, a resonance medium 5, and a low frequency vibrator 2. The low frequency vibrator 2 is assembled with the multimedia unit 1 and the multimedia unit 1 is placed on the resonance medium 5 with the low frequency vibrator 2 abutting against the resonance medium 5. In this situation, the resonance medium 5 is a normal desk. In other optional embodiment, the resonance medium 5 may be a frame for supporting the multimedia unit 1.

Figure 2:
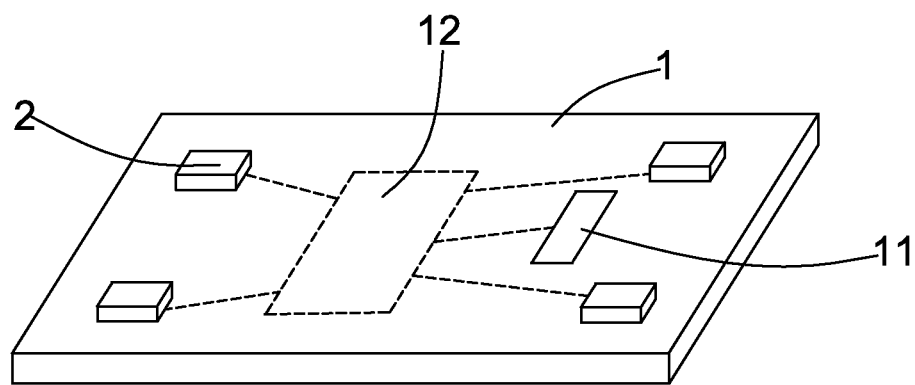
FIG. 2 is a schematic illustration of a multimedia unit of the speaker system.
Figure 3:
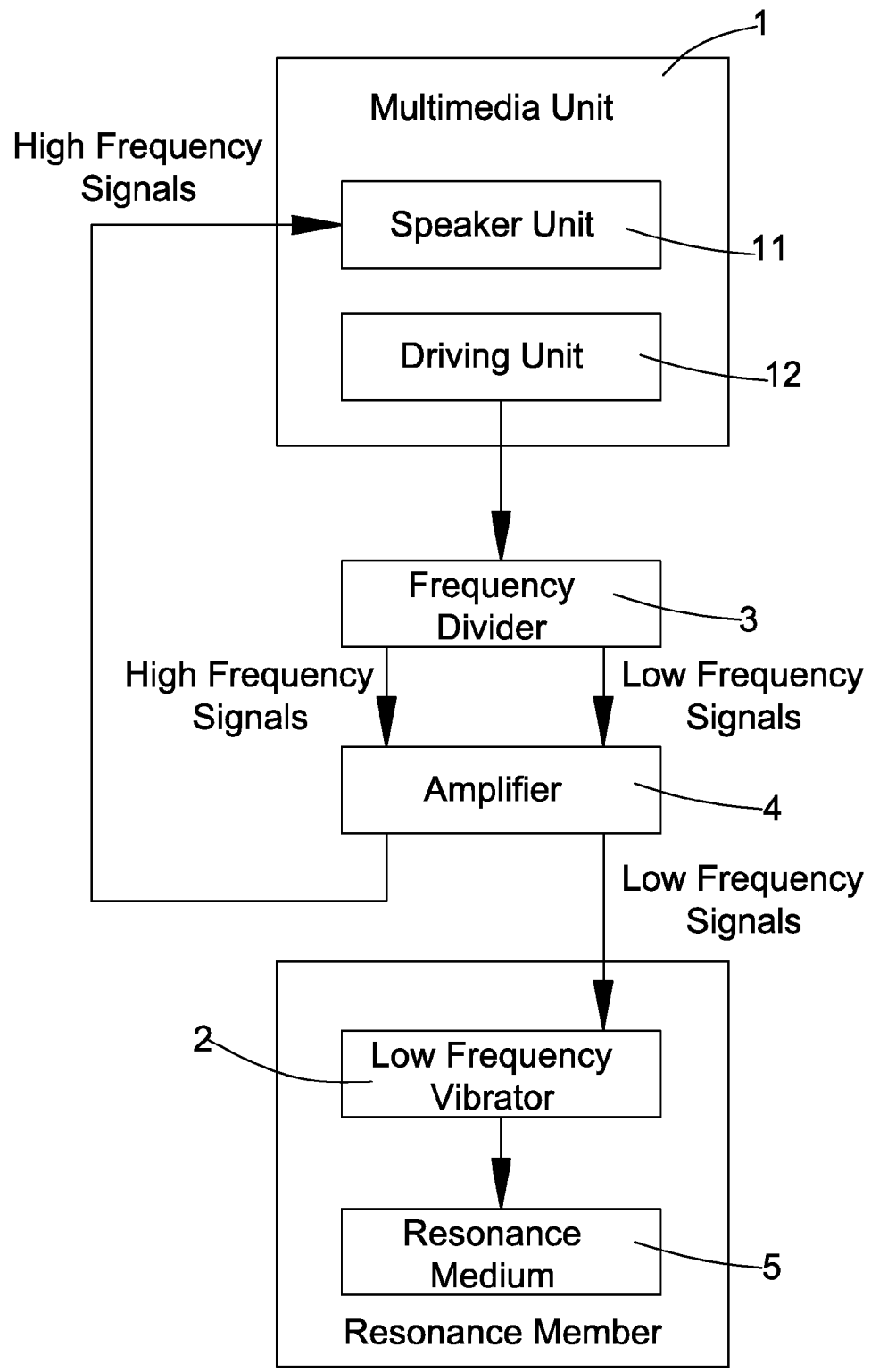
FIG. 3 is a schematic principle diagram of the speaker system.

Referring to FIGS. 2 and 3, the multimedia unit 1 includes a speaker unit 11 and a driving unit 12 for providing audio signals to the speaker unit 11. The speaker unit 11 may generate sounds based on the audio signals obtained from the driving unit 12. Referring back to FIG. 1, the driving unit 12 also provides audio signals to the low frequency vibrator 2. Especially, the signals provided to the low frequency vibrator 2 are low frequency signals, and the signals provided to the speaker unit are high or intermediate frequency signals. In this embodiment, the multimedia unit may be a notebook computer, a panel computer, a mobile phone, or a display unit. The low frequency vibrators 2 are assembled on the back of multimedia unit 1.

As an optional embodiment, the speaker system 10 further includes a frequency divider 3 connecting to the driving unit 12 for receiving audio signals from the driving unit 12 and dividing the signals into low frequency signals and high/intermediate frequency signals. The low frequency signals are transmitted to the low frequency vibrators 2, and the high/intermediate frequency signals are transmitted to the speaker units 11. Optionally, the speaker system 10 further includes an amplifier for receiving the signals from the frequency divider 3 for amplifying the low and high/intermediate frequency signals and then transmitting the amplified low and high/intermediate frequency signals to the speaker units 11 and the low frequency vibrators 2, respectively.

In this embodiment, the frequency divider 3 is an optional element. Without the frequency divider 3, the driving unit 12 directly transmits audio signals to the speaker units 11 and the low frequency vibrator 2. The speaker units 11 and the low frequency vibrators 2 could respectively respond to the high/intermediate frequency signals and low frequency signals by virtue of their inherent physical characters. Usage of the frequency divider can improve the accuracy of the frequency selection and further improve the sound quality. In brief, with the frequency divider, the low frequency vibrators and the speaker units receive signals from the driving unit indirectly, and without the frequency driver, the low frequency vibrators and the speaker units receive signals from the driving unit directly.

The speaker units 11 are used to generate sound corresponding to high/intermediate frequency signals, just like normal speakers. The low frequency vibrators 2 are used to vibrate corresponding to low frequency signals. While the low frequency vibrators 2 vibrate, the low frequency vibrators 2 form a low frequency resonance member together with the resonance medium 5, which produces sounds with low frequency, like bass, and improves the sound quality.

In this embodiment, the driving unit is an element of the multimedia unit 1, in fact, it can also be an independent element for connecting the multimedia unit 1 to the speaker units 11 and the low frequency vibrators 2. The frequency divider 3 and the amplifier 4 could be integrated within the multimedia unit 1, and also could be independent elements which can be additionally assembled with the speaker system in demand. FIG. 3 shows the frequency divider 3 and the amplifier 4 independent from the multimedia unit 1. In fact, the frequency divider 3 and the amplifier 4 can be integrated within the multimedia unit 1.

For achieving better performance of the sound quality, the low frequency vibrator 2 may be a bone conductor element, such as a Bone Conductor Receiver. The weight of the multimedia unit provides the low frequency vibrator with pre-pressure.

A method for driving the speaker system is described as follows. The method comprises the steps of:

Providing a multimedia unit including a plurality of speaker units and a driving unit;

Providing a plurality of low frequency vibrators assembled with the multimedia unit;

Providing a resonance medium for carrying the multimedia unit, the low frequency vibrator located between the multimedia unit and the resonance medium and abutting against the resonance medium;

Driving the speaker units to generate sound by high/intermediate frequency signals transmitted from the driving unit, and driving the low frequency vibrators to vibrate by low frequency signals transmitted from the driving unit;

Forming a resonance member between the low frequency vibrators and the resonance medium for producing low frequency sound.

Optionally, a frequency divider may be provided for receiving audio signals from the driving unit and dividing the signals into high/intermediate frequency signals and low frequency signals, then transmitting the high/intermediate frequency signals and low frequency signals to the speaker units and the low frequency vibrators, respectively.

Optionally, an amplifier may be provided for amplifying the signals transmitted from the frequency divider.

Optionally, the low frequency vibrator is a bone conductive receiver.

While the present invention has been described with reference to the specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A speaker system, comprising:
   a multimedia unit including a plurality of speaker units;
   a resonance medium for supporting the multimedia unit;
   a plurality of low frequency vibrators assembled with the multimedia unit and abutting against the resonance medium;
   a driving unit for providing high frequency audio signals to the speaker units and low frequency audio signals to the low frequency vibrators;
   a combination of the low frequency vibrators and the resonance medium as a whole serving as a resonance member for producing low frequency sound.

2. The speaker system as described in claim 1, wherein the low frequency vibrators comprises bone conductive receivers.

3. The speaker system as described in claim 1 further comprising a frequency divider for receiving the audio signals and then dividing the signals into high frequency signals for transmitting to the speaker units and low frequency signals for transmitting to the low frequency vibrators.

4. The speaker system as described in claim 3 further comprising an amplifier connected to the frequency divider for amplifying the high frequency signals and the low frequency signals.

5. A speaker system, comprising:
   a multimedia unit including a driving unit for providing audio signals, a plurality of speaker units receiving high frequency signals from the driving unit;
   a resonance medium for supporting the multimedia unit;
   a plurality of low frequency vibrators assembled with the multimedia unit and abutting against the resonance medium; wherein
   the low frequency vibrators receive low frequency signals from the driving unit and produce low frequency sound by abutting against the resonance medium.

6. The speaker system as described in claim 5 further comprising a frequency divider for receiving the audio signals and then dividing the signals into high frequency signals for transmitting to the speaker units and low frequency signals for transmitting to the low frequency vibrators.

7. The speaker system as described in claim 6 further comprising an amplifier connected to the frequency divider for amplifying the high frequency signals and the low frequency signals.

8. A method for driving a speaker system comprising the steps of:
   providing a multimedia unit including a plurality of speaker units;
   proving a driving unit for providing audio signals including high frequency signals and low frequency signals;
   providing a plurality of low frequency vibrators assembled with the multimedia unit;
   providing a resonance medium for carrying the multimedia unit, the low frequency vibrator abutting against the resonance medium;
   driving the speaker units to generate sound by high frequency signals transmitted from the driving unit, and driving the low frequency vibrators to vibrate by low frequency signals transmitted from the driving unit;
   forming a resonance member by combining the low frequency vibrators and the resonance medium for producing low frequency sound.

* * * * *